United States Patent [19]
Lin et al.

[11] Patent Number: 5,619,686
[45] Date of Patent: Apr. 8, 1997

[54] SOURCE SYNCHRONIZED DATA TRANSMISSION CIRCUIT

[75] Inventors: Allan Lin, San Jose; Jay Deng, Union City, both of Calif.

[73] Assignee: National Semiconductor Corporation, Santa Clara, Calif.

[21] Appl. No.: 154,744

[22] Filed: Nov. 18, 1993

[51] Int. Cl.$^6$ ........................................... G06F 1/06
[52] U.S. Cl. ........................................... 395/552
[58] Field of Search ........................................... 395/550

[56] References Cited

U.S. PATENT DOCUMENTS

| | | | |
|---|---|---|---|
| 3,681,759 | 8/1972 | Hill, III | 340/172.5 |
| 3,891,804 | 6/1975 | Hachenburg | 179/15 |
| 4,144,410 | 3/1979 | Flickinger et al. | 179/15 |
| 4,472,711 | 9/1984 | Stollberger et al. | 340/825.05 |
| 4,495,617 | 1/1985 | Ampulski et al. | 370/86 |
| 4,536,876 | 8/1985 | Bahr et al. | 370/86 |
| 4,554,673 | 11/1985 | Stevens | 375/118 |
| 4,566,098 | 1/1986 | Gammage et al. | 370/89 |
| 4,674,086 | 6/1987 | Szczpanek et al. | 370/86 |
| 4,716,575 | 12/1987 | Douros et al. | 375/3 |
| 4,944,038 | 7/1990 | Hardy et al. | 370/85.5 |
| 5,204,882 | 4/1993 | Chao et al. | 375/106 |
| 5,206,857 | 4/1993 | Farleigh | 370/85.5 |
| 5,212,716 | 5/1993 | Ferraiolo et al. | |
| 5,239,628 | 8/1993 | Hasebe et al. | 395/325 |
| 5,241,543 | 8/1993 | Amada et al. | 370/102 |
| 5,247,518 | 9/1993 | Takiyasu et al. | 370/85.15 |
| 5,329,559 | 7/1994 | Wong et al. | 375/119 |
| 5,392,422 | 2/1995 | Hoel et al. | 395/550 |

FOREIGN PATENT DOCUMENTS

| | | |
|---|---|---|
| 0466593 | 1/1992 | European Pat. Off. . |
| 0498064 | 8/1992 | European Pat. Off. . |

*Primary Examiner*—Kevin A. Kriess
*Assistant Examiner*—John O. Chavis
*Attorney, Agent, or Firm*—Limbach & Limbach L.L.P.

[57] ABSTRACT

A data source circuit and a complementary data acquisition circuit which can transmit and receive data at a higher rate than a conventional data source circuit which uses similar fabrication technology. A data source circuit of the present invention has an input for receiving a periodic source clock signal having a period T; a synchronization signal generator for generating, based on said downstream-clock signal, a series of one or more periodic synchronization signals having periods substantially equal to T, each synchronization signal being delayed from a previous synchronization signal; and a transmitter for transmitting one or more sub-words of a multi-bit data word, each sub-word having one or more bits, separate ones of said one or more sub-words being transmitted responsive to separate progressively delayed combined pairs of said synchronization signals. In a preferred embodiment of the present invention particularly suited for use in a point to point (e.g. a ring-type) data network, an acquisition circuit and a source circuit are integrated as a receiver/retransmission node.

31 Claims, 16 Drawing Sheets

SOURCE SYNCHRONIZED DATA TRANSMISSION CIRCUIT

TECHNICAL FIELD OF THE INVENTION

The present invention relates to data source and data acquisition circuits, and in particular, to data source and data acquisition circuits which can transmit and receive data at a higher rate than conventional data source and acquisition circuits which use similar fabrication technology.

BACKGROUND OF THE INVENTION

A conventional data source circuit serially transmits multi-bit words, periodically presented in parallel to the conventional data source circuit input, by sequentially toggling a flip-flop output when a bit to be transmitted differs from an immediately previous transmitted bit. As is discussed below, the conventional data source circuit fails to perform as desired at high data transmission rates.

Referring now to FIG. 1, there is shown an example of a conventional data source circuit 10. Specifically, the conventional data source circuit of FIG. 1 serially transmits individual bits of 7-bit words; the 7-bit words are periodically and continuously presented in parallel to a data input 20. Since 7-bit words are presented to the data input 20 periodically and continuously, the individual bits of each 7-bit word presented must be transmitted at a rate such that data does not "back up". Such a "back up" condition is known in the art as data overwrite.

If, for example, the 7-bit words are presented to input 20 at a rate of 5 MHz, the individual bits must be transmitted along data transmission line 22 at a 35 MHz rate. The conventional data source circuit 10 accomplishes this 35 MHz data transmission scheme as explained below.

Referring still to FIG. 1, separate data bits $D_a$-$D_g$ of a 7-bit word to be transmitted are presented to separate ones of a series of bit-change detectors 21a–21g, respectively. The bit-change detectors are a series of 2-input XOR devices. XOR device 21b, for example, has presented to its inputs bits $D_b$ and $D_a$. Likewise, XOR device 21c has presented to its inputs bits $D_c$ and $D_b$, and so on up to XOR device 21g, which has as its inputs bits $D_g$ and $D_e$.

Finally, XOR device 21a has as its inputs bits $D_a$ and $D_g$. More precisely, the bit $D_g$ input to XOR device 21a is always $D_g$ of the 7-bit word previously presented to data input 20. But $D_g$ of the previously presented 7-bit word must thus be buffered so that it is not overwritten by bit $D_g$ of a currently-presented 7-bit word. The bit $D_g$ buffering mechanism is not shown in FIG. 1.

The result of daisy-chaining the 2-input XOR devices 21a–21g is that a particular XOR device asserts at its output a "bit-change" signal only when a to-be transmitted bit differs from the immediately previous transmitted bit. For example, the output of XOR device 21c is asserted only if bit $D_c$ differs from bit $D_b$; and the output of XOR device 21a is asserted only if bit $D_a$ differs from bit $D_g$ of the previously presented word.

The outputs of the XOR devices 21a–21g (i.e. the results of the "bit change" comparisons) are presented to second inputs 25a–25g, respectively, of 3-input AND devices 24a–24g, respectively.

Meanwhile, a 5 MHz periodic source clock signal, $CLK_0$, is presented to clock input 29. A new 7-bit data word is available at data input 20 coincident with each rising edge of clock signal $CLK_0$. From clock input 29, $CLK_0$ is passed through seven successive delay elements 31a–31g, respectively, to produce delayed clock signals $CLK_a$–$CLK_g$, respectively. $CLK_a$–$CLK_g$ are of the same period and frequency as $CLK_0$. The importance of which will be seen below, each delay element 31a–31g must be chosen to delay a signal presented to it by approximately the time needed to transmit a data input bit. That is, for a 35 MHz transmission rate of individual bits, each delay element 31a–31g must delay the delayed clock signal presented to by approximately 28 nsecs. The timing diagram of FIG. 2 shows the relative timing of $CLK_0$ and the delayed clock signals $CLK_a$–$CLK_g$.

Delayed clock signals $CLK_a$–$CLK_g$, respectively, are presented to first inputs of 3-input AND devices 23a–23g, respectively.

Delayed clock signals $CLK_a$–$CLK_g$, respectively, are also presented to pulse-width control inverters 33a–33g, respectively. Pulse-width control inverters 33a–33g then output periodic pulse width control signals $PWC_a$–$PWC_g$, respectively. As shown in the timing diagram of FIG. 2, PWCa-PWCg, respectively, are signals inverted and delayed relative to $CLK_a$–$CLK_g$, respectively.

The importance of which will also be discussed in more detail below, each of the pulse-width control inverters 33a–33g must be chosen so that a signal presented to it is delayed by approximately half the time needed to transmit a data input bit. That is, for a 35 MHz transmission rate of individual bits, the pulse-width control inverters must delay the delayed clock signal presented to it by approximately 14 nsecs.

$PWC_a$–$PWC_g$, respectively, are presented to third inputs 27a–27g, respectively, of 3-input AND devices 24a–24g.

Only when the delayed clock signal and pulse width control signal associated with a particular bit-change signal (i.e. the ones presented to the same 3-input AND device as the particular bit change signal) are both high can the bit-change signal be transmitted to the output of the 3-input AND device. Because of the chosen delay times of delay elements 31a–31g and pulse-width controllers 33a–33g, at any one time there is only one delayed clock signal and associated pulse-width control signal combination where both the delayed clock signal and the pulse-width control signal are high together. As a result, bit-change signals present at the XOR devices 21a–21 g are transmitted one at a time.

It is important that these bit-change signals are transmitted one at a time because the transmitted bit-change signals are presented to inputs of a 7-input OR device 39, and an output of the 7-input OR device 39 is connected to a clock input 36 of a toggle flip-flop 34. Because the toggle flip-flop 34 has its inverted data output tied to its data input, each time the output of the 7-input OR device pulses (i.e. a bit-change signal has been transmitted), to signal a bit-change in the input data, the output of the toggle flip-flop clocks to its opposite state. That is, when the bit-change signals are transmitted by the 3-input AND devices 24a–24g one at a time, the output of the 7-input OR device represents the one-at-a-time transmitted bit-change signals. In this case, then, the output 22 of the toggle flip-flop 34 represents the serial transmission of the data bits $D_a$–$D_g$ of the 7-bit data words periodically and continuously presented to data input 20.

The conventional data source circuit 10 of FIG. 1 works well when the data to be transmitted is presented to its input 20 at a relatively low rate. However, there is an ever-increasing need for higher data-rate transmission systems.

For example, with the advent of multimedia (i.e. integrated video, audio, and data), and its heavy data and throughput demands, there is a growing need for higher-rate data transmission links between internal cards of personal computers. Furthermore, there is a need for large amounts of data to be transmitted quickly among distributed computer resources.

Conventional data source circuits such as the conventional data source circuit 10 of FIG. 1 fail to perform as desired at today's required higher data transmission rates. The problem is that, in a worst-case condition of each transmitted bit being different from an immediately previous transmitted bit, a stable periodic signal must be generated at the CLK node of toggle flip-flop 34 at a frequency equal to the desired data transmission rate.

Because of inherent process limitations, even with late generation high-speed logic fabrication technology such as 1 μm CMOS, it is presently impossible to generate such a periodic signal at frequencies equal to high desired data transmission rates.

For example, to transmit 7-bit words which all strictly contain alternating "1"'s and "0"'s, at a rate of 350 MHz, with the conventional data source circuit 10 of FIG. 1 requires the generation of a 350 MHz stable clock (that is, a clock which transitions $700\times10^6$ times per second, or 1 transition per approximately 1.4 nsec) at the CK node of the toggle flip-flop 34. Given a basic element delay of 1 nsec for the pulse width controller inverters 33a–33g, it is presently impossible to implement such a clock in a 1 μm CMOS fabrication technology.

Furthermore, even if it were possible to implement such a 350 MHz clock in a 1 μm CMOS fabrication technology, the sequential element (i.e. the toggle flip-flop 34) of the conventional system would not be fast enough to be able to respond correctly to a 350 MHz clock signal.

Also, with each increase in speed that comes with advances in fabrication technology, there will be a concomitant requirement for transmission rates beyond the capability of the conventional data source circuit which uses even the most advanced fabrication technology. Furthermore, if a suitable solution is available using more primitive fabrication technology, this solution may be less expensive than a solution which requires the most advanced technology.

SUMMARY OF THE INVENTION

The present invention is directed to a data source circuit and a complementary data acquisition circuit which can transmit and receive data at a higher rate than a conventional data source circuit which uses similar fabrication technology.

A data source circuit of the present invention comprises means for receiving a periodic source clock signal having a period T; a synchronization signal generator for generating, based on said source clock signal, a series of one or more periodic synchronization signals having periods substantially equal to T, each synchronization signal being delayed from a previous synchronization signal; and a transmitter for transmitting one or more sub-words of a multi-bit data word, each sub-word having one or more bits, separate ones of said one or more sub-words being transmitted responsive to separate progressively delayed combined pairs of synchronization signals.

In a preferred embodiment of the present invention, the synchronization signal generator of the data source circuit includes a phase-lock loop for calibrating the generation of the synchronization signals to a reference signal.

A complementary data acquisition circuit of the present invention comprises means for receiving a periodic acquisition reference clock signal having a period T; a sampling signal generator for generating, based on said acquisition reference clock signal, a series of periodic sampling signals having periods substantially equal to T, each sampling signal being delayed from a previous sampling signal; and a sampler for sampling one or more sub-words of a multi-bit data word, separate ones of said one or more sub-words being sampled responsive separate sampling signals.

In a preferred embodiment of the data acquisition circuit of the present invention, the sampling signal generator of the data acquisition circuit includes a phase-lock loop for calibrating the generation of the sampling signals to a reference signal, preferably the acquisition reference clock signal.

In another preferred embodiment of the present invention, an acquisition circuit and a source circuit are integrated as a receiver/retransmission node. This embodiment is particularly suited for use in a point-to-point data network, such as a ring-type network.

DETAILED DESCRIPTION OF THE INVENTION

Figure 3:
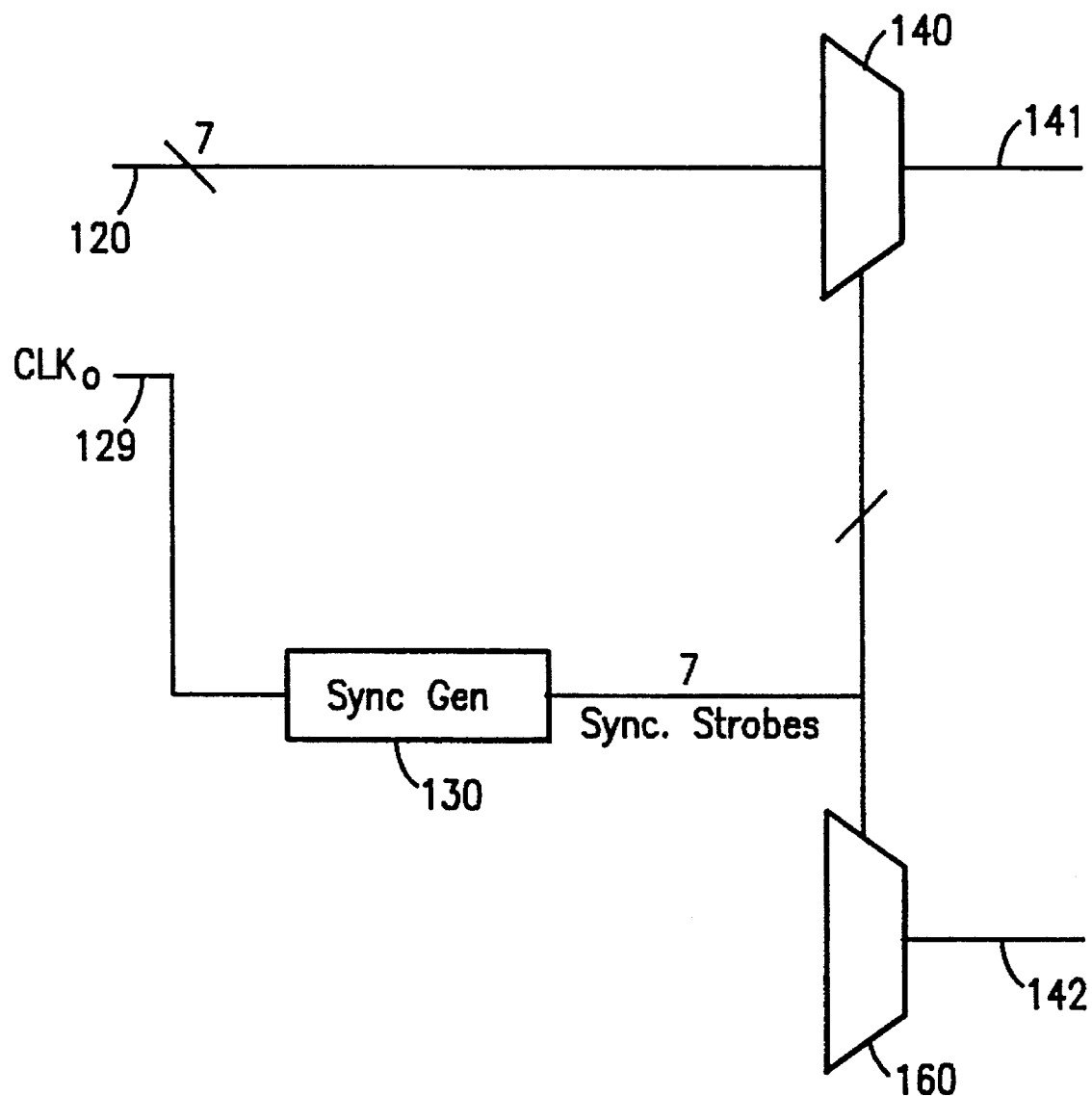
FIG. 3 is a block diagram of a data source circuit of the present invention.

Referring now to FIG. 3, there is shown one embodiment of a data source circuit 100 in accordance with the present invention, for serially transmitting sub-words of multi-bit data words presented to its input 120. Like the conventional data source circuit 10 of FIG. 1, the data source circuit 100 is for serially transmitting individual bits of 7-bit words. The 7-bit words are periodically presented in parallel to data input 120. Then, separate data bits $D_a$–$D_g$ are transmitted serially by a transmitter 140 onto data transmission line 141.

Figure 4:
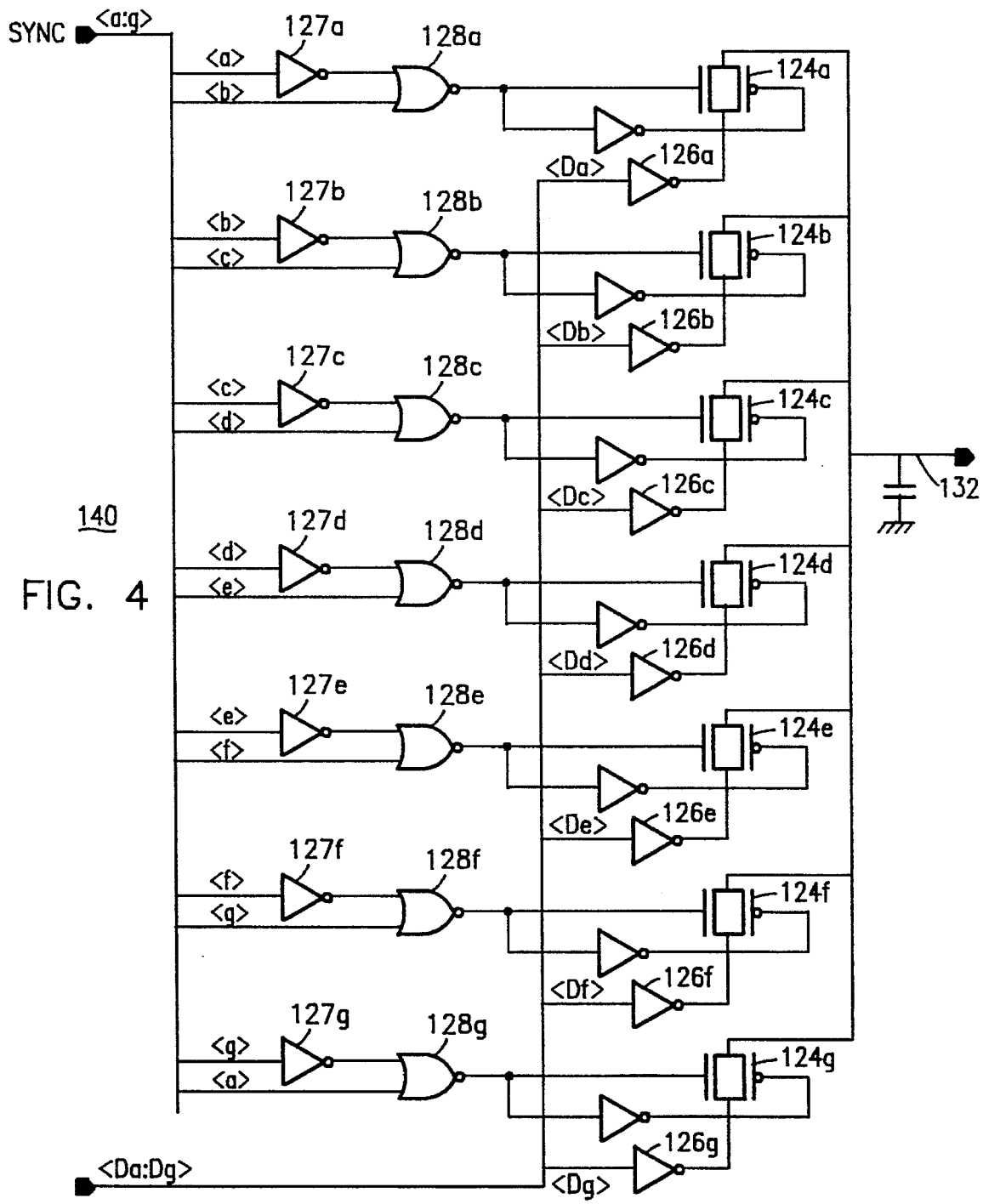
FIG. 4 is a schematic of a transmitter of the data source circuit of the present invention.

Referring now to FIG. 4, there is shown a transmitter 140 of one data source circuit embodiment of the present invention. Separate data bits $D_a$–$D_g$ of a 7-bit word to be transmitted are presented to separate ones of a series of transmission gates 124a–124g via separate ones of a series of inverters 126a–126e. As will be further explained, the transmission gates 124a–124g function as switches to enable one-at-a-time transmission of data bits $D_a$–$D_g$. It should be particularly noted at this time that the transmission gates 124a–124g are not strictly analogous to the 3-input AND gates 24a–24g of the conventional data source circuit of FIG. 1. That is, while the transmission gates 124a–124g selectively enable transmission of the data bits $D_a$–$D_g$ themselves, the 3-input AND gates 24a–24g enable transmission of mere bit-change signals.

Inverters 126a–126g, respectively, are buffers that provide current to drive the inputs to the transmission gates 124a–124g, respectively. Such an inverter/driver use is well known in the art.

Meanwhile, referring again to FIG. 3, a 50 MHz periodic source clock signal, $CLK_0$, is presented to clock input 129. A new 7-bit data word is available at data input 120 coincident with each rising edge of source clock signal $CLK_0$. From clock input 129, $CLK_0$ is passed to synchronization signal generator 130.

Figure 5:
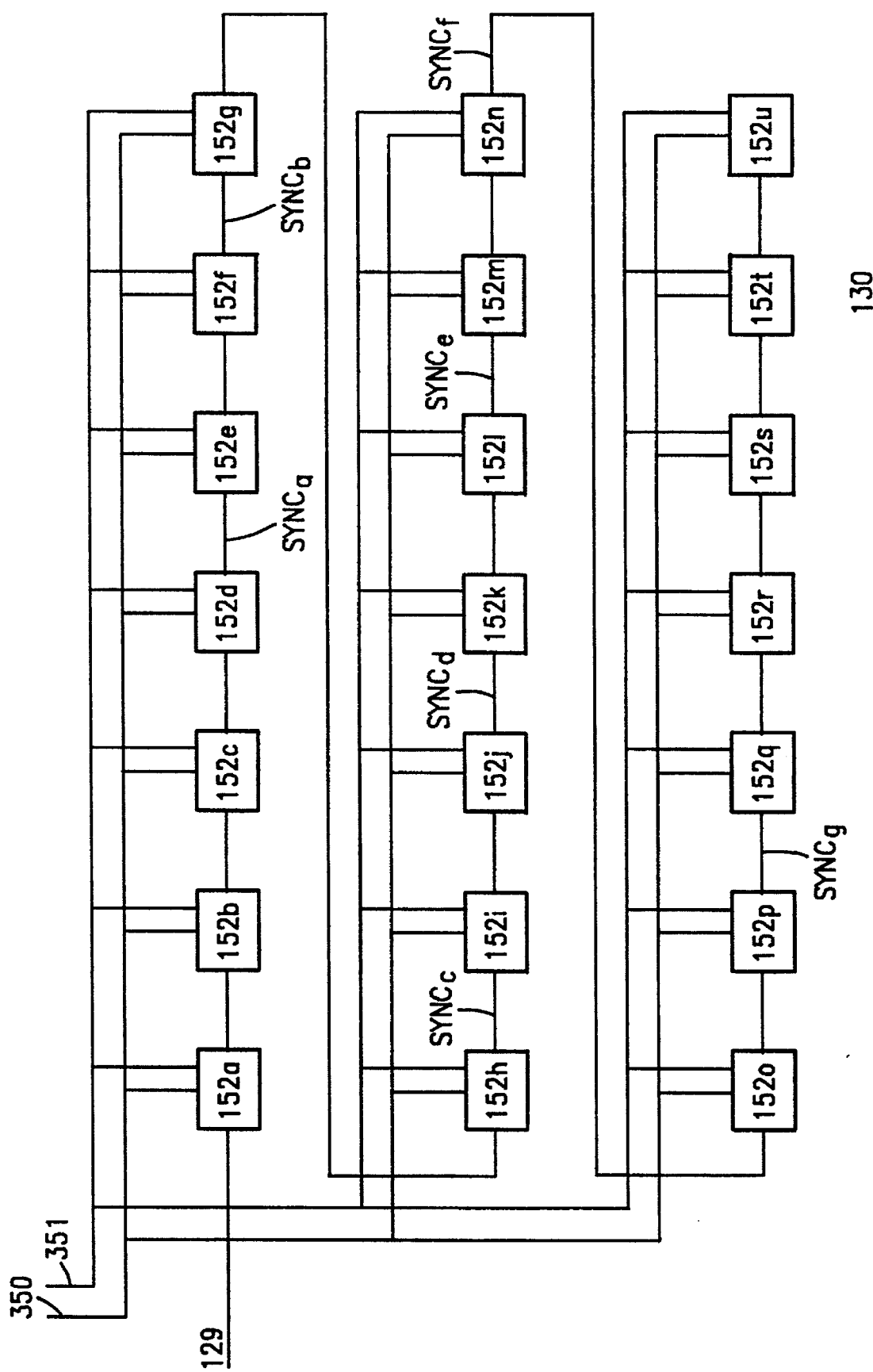
FIG. 5 is a schematic of the synchronization generator of the data source circuit of the present invention.

Referring now to FIG. 5, from clock input 129, $CLK_0$ is passed through twenty successive delay elements 152a–152t of synchronization signal generator 130. It should be noted that the delay elements 152a–152t may be, but are not necessarily identical to the delay elements 31a–31g or pulse width controllers 33a–33g of conventional data source circuit 10.

Figure 6:
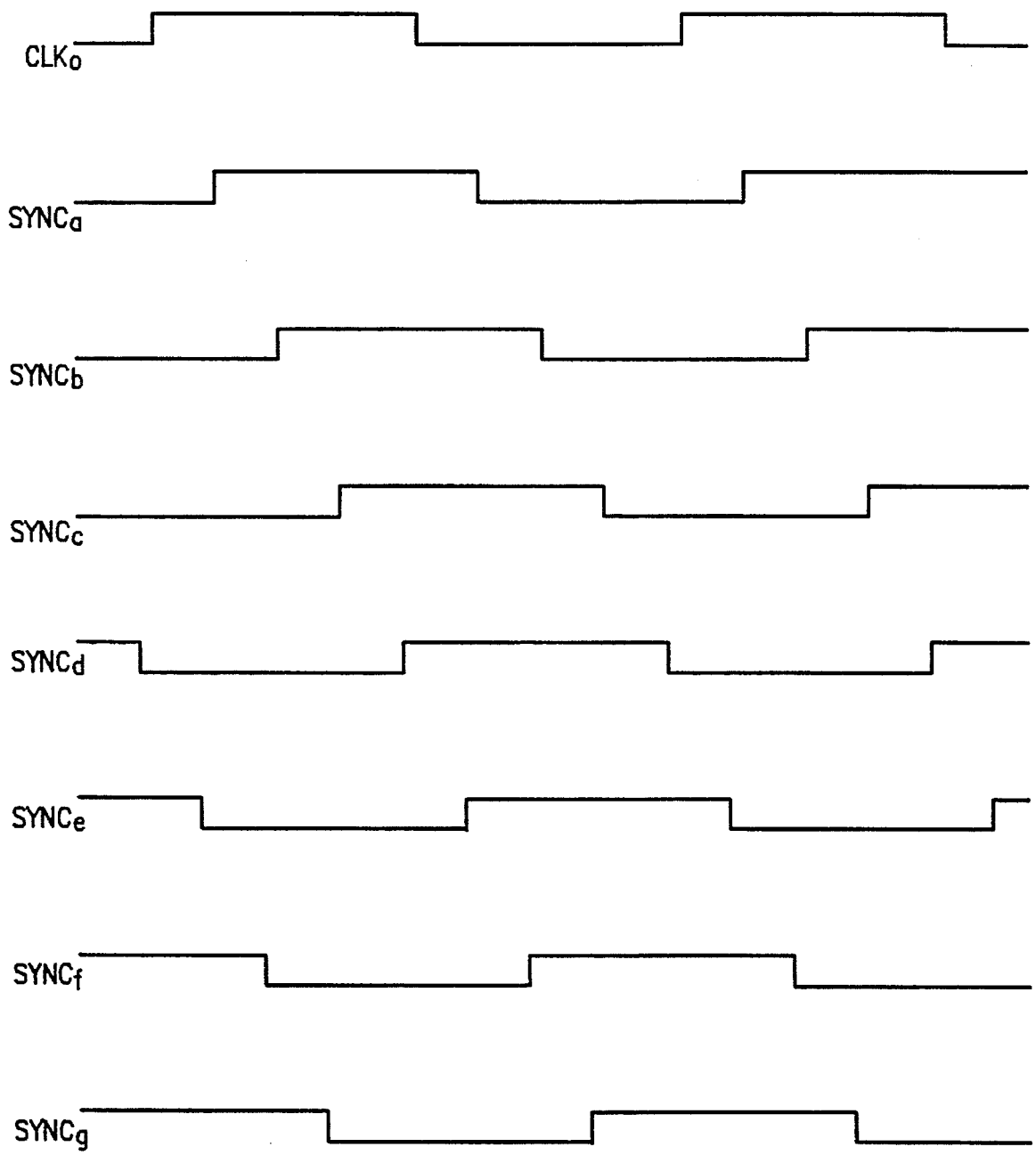
FIG. 6 is a timing diagram showing the relative timing of the source clock signal and the synchronization signals.

Output delay inverters 152d, 152f, 152h, 152j, 152l, 152n, and 152p are "tapped" to obtain periodic synchronization signals $SYNC_a$–$SYNC_g$, respectively. Synchronization signals $SYNC_a$–$SYNC_g$ are of the same period and frequency as $CLK_0$, and each synchronization signal is phase-delayed from a previous synchronization signal. That is, $SYNC_b$ is phase delayed from $SYNC_a$; $SYNC_c$ from $SYNC_b$; and on up to $SYNC_g$, which is phase delayed from $SYNC_f$. Due to the periodic nature of the synchronization signals, $SYNC_a$ is phase-delayed from $SYNC_g$. The timing diagram of FIG. 6 shows the relative timing of $CLK_0$ and the synchronization signals $SYNC_a$–$SYNC_g$.

Separate progressively delayed combined pairs of synchronization signals are presented to the two inputs of separate 2-input NOR devices, a lesser delayed of the two synchronization signals being passed first through an inverter. By "progressively delayed" it is meant that for each combined pair presented to a 2-input NOR device, one synchronization signal is less delayed than the other, more delayed, synchronization signal. Furthermore, for each separate combined pair, neither of the two synchronization signals is delayed both: a) more than a less delayed synchronization signal of any other combination, and b) less than a more delayed synchronization signal of the other combination.

Specifically, referring again to FIG. 4, synchronization signals $SYNC_a$–$SYNC_g$, respectively, are presented to inverters 127a–127g, respectively, which output signals corresponding to $SYNC_a$–$SYNC_g$, respectively, but are inverted and slightly phase-delayed. An output of each inverter 127a–127g, respectively, is presented to a first input of each two-input NOR device 128a–128g, respectively. Furthermore, each synchronization signal $SYNC_b$, $SYNC_c$, ..., $SYNC_g$, $SYNC_a$, respectively, is presented to a second input of each two-input NOR device 128a–128g, respectively.

That is, inverted phase-delayed $SYNC_a$ is presented to the first input of NOR device 127a and $SYNC_b$ is presented to the second input of NOR device 127a. This pattern is repeated for the remaining NOR devices 127b–127g; inverted phase-delayed $SYNC_g$ is presented to the first input of NOR device 127g and $SYNC_a$ is presented to the second input of NOR device 127g.

Only when the two signals presented to the first and second inputs of a particular two-input NOR device 128a–128g are low does the two-input NOR device assert its output. That is, accounting for the inverters 127a–127g, an output of a particular NOR device 128a–128g is asserted only when the following two conditions are simultaneously met: first, a synchronization signal presented to the NOR device first input, via an inverter 127a–127g, is high before being inverted; and second, a following synchronization signal, presented to the NOR device second input is low.

Keeping the delay times of the inverters 130a–130g relatively smaller than the phase differences of the two synchronization signals $SYNC_a$–$SYNC_g$ input to a particular two-input NOR device guarantees that the 2-input NOR devices outputs are asserted one at a time.

The NOR device 128a–128g outputs are presented to respective control gate terminals of CMOS transmission gates 124a–124g, respectively. An asserted NOR device output "switches on" a respective transmission gate, enabling the transmission gate to pass a data bit presented at its input to its output. It may be recognized by one skilled in the art that any suitable tristatable switching devices may substituted for CMOS transmission gates 124a–124g.

Each enabled transmission gate 124a–124g output is presented to data transmission line 132. A discrete capacitor is shown on FIG. 4 on data transmission line 132. However, one skilled in the art will recognize that data transmission line 132 already has capacitance equal to the total output capacitance of the transmission gates and the parasitics of the line, and that therefore such a discrete capacitor is not necessary. The capacitance at transmission line 132 dynamically holds a last transmitted data bit until another data bit is newly transmitted.

Because of the one-at-a-time assertion of NOR device outputs, a signal on data transmission line 132 represents the one-at-a-time transmission of data signals $D_a$–$D_g$. Thus, it can be seen that the transmission of the data bits $D_a$–$D_g$ is responsive to separate "progressively delayed" combined pairs of synchronization signals.

Figure 1:
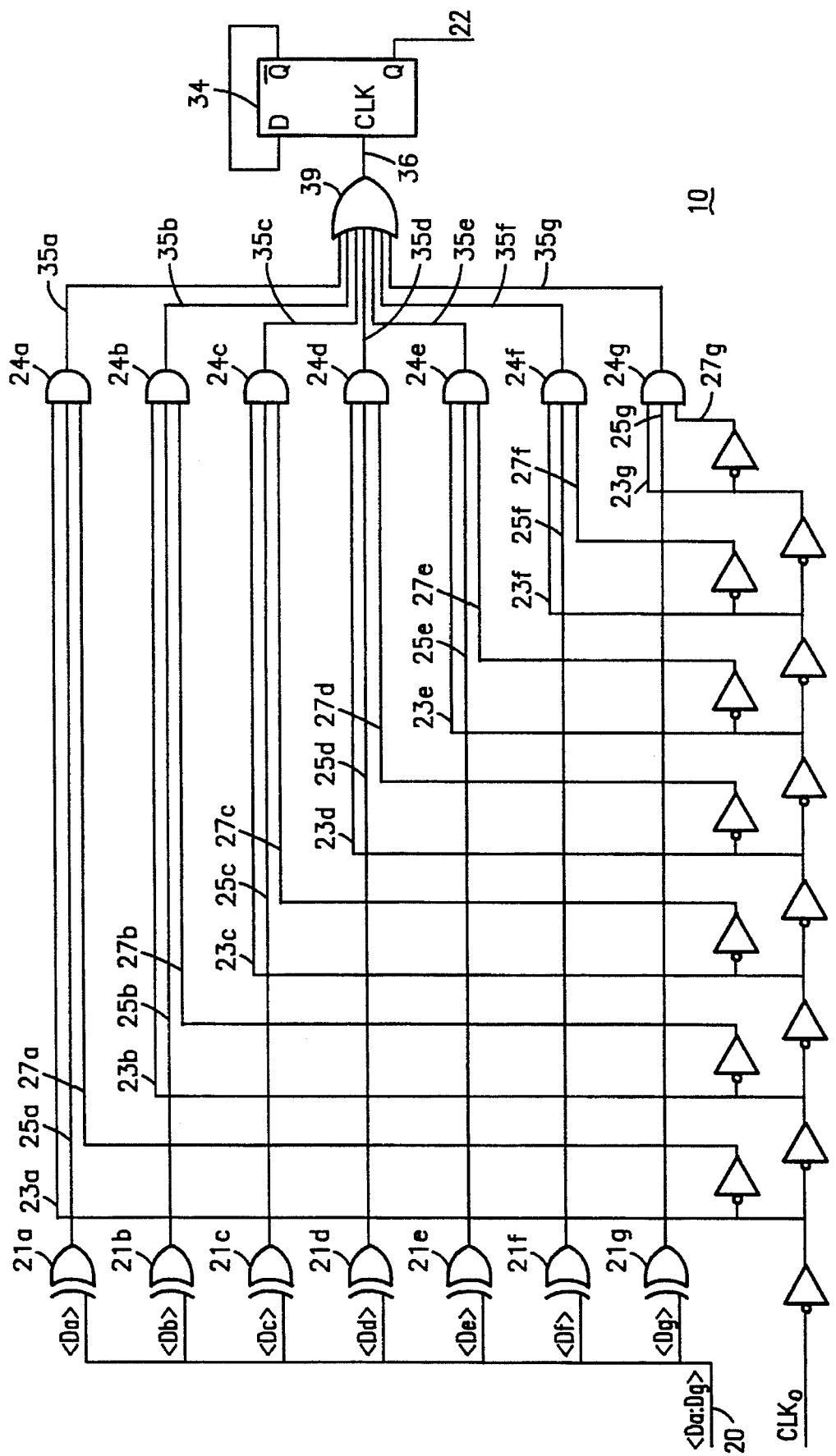
FIG. 1 is a block diagram of a conventional data source circuit.
Figure 2:
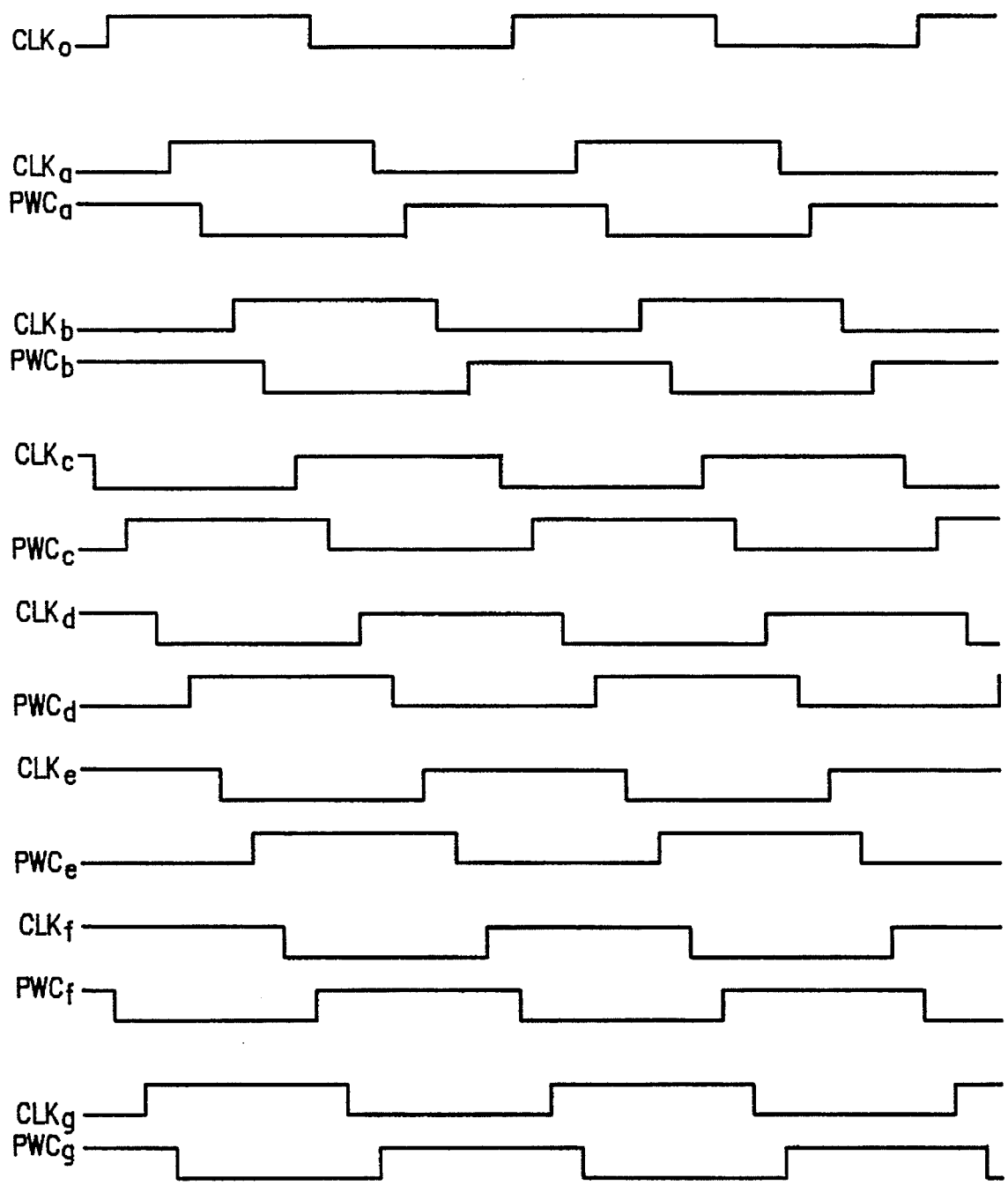
FIG. 2 is a timing diagram showing the relative timing of signals present in the conventional data source circuit of FIG. 1.

As is the case with the conventional data source circuit 10 of FIG. 1, when each bit of a multi-bit word to be transmitted serially across data transmission line 132 of data source circuit 100 is different from an immediately previous transmitted bit, the data source circuit 100 is "worst case" switched on transmission line 132. However, a data source circuit in accordance with the present invention provides the advantage that transmission of such an alternating data string requires generation of an equivalent clock of only half the frequency required to be generated by the conventional data source circuit to transmit the same alternating data string.

As a specific example, to continuously transmit 7-bit words which all have such a "worst case" alternating bit pattern at a rate of 350 Mbits requires the generation of a time base (reflected by the spacing between rising edges of the respective synchronization signals $SYNC_a$–$SYNC_g$) which is half as critical as a 350 MHz clock. That is, the conventional data source circuit needs to control a 1.4 nsec pulse and the data source circuit of the present invention requires control of a 2.8 nsec spacing.

Furthermore, the transmission gate controlled tri-state transmission line 132 eliminates the need for a sequential element such as the toggle flip-flop 34 of the conventional circuit 10. Hence, the setup and hold times are no longer critical and the tri-state net can respond correctly to a 350 Mbit/sec data rate.

Additionally, unlike the conventional data source circuit 10 of FIG. 1, the data source circuit 100 shown in FIG. 3 does not strictly require that data bit $D_g$ be buffered. That is, as can be seen by inspection of the timing diagram of FIG. 6, data bit $D_g$ will not be overwritten before transmission if the delay element 152a–152t delays are short enough such that all of data bits $D_a$–$D_g$ are transmitted by transmitter 140 within a $CLK_0$ period.

In a preferred embodiment of a present invention source circuit, however, a source latch/buffer mechanism is used to extend the time that multi-bit data words presented to input 120 are available for transmission by transmitter 140. This source latch/buffer mechanism allows additional time for data bits $D_a$–$D_g$ presented to input 120 to stabilize before they are transmitted and to remain stable for some time after they are transmitted.

Figure 7:
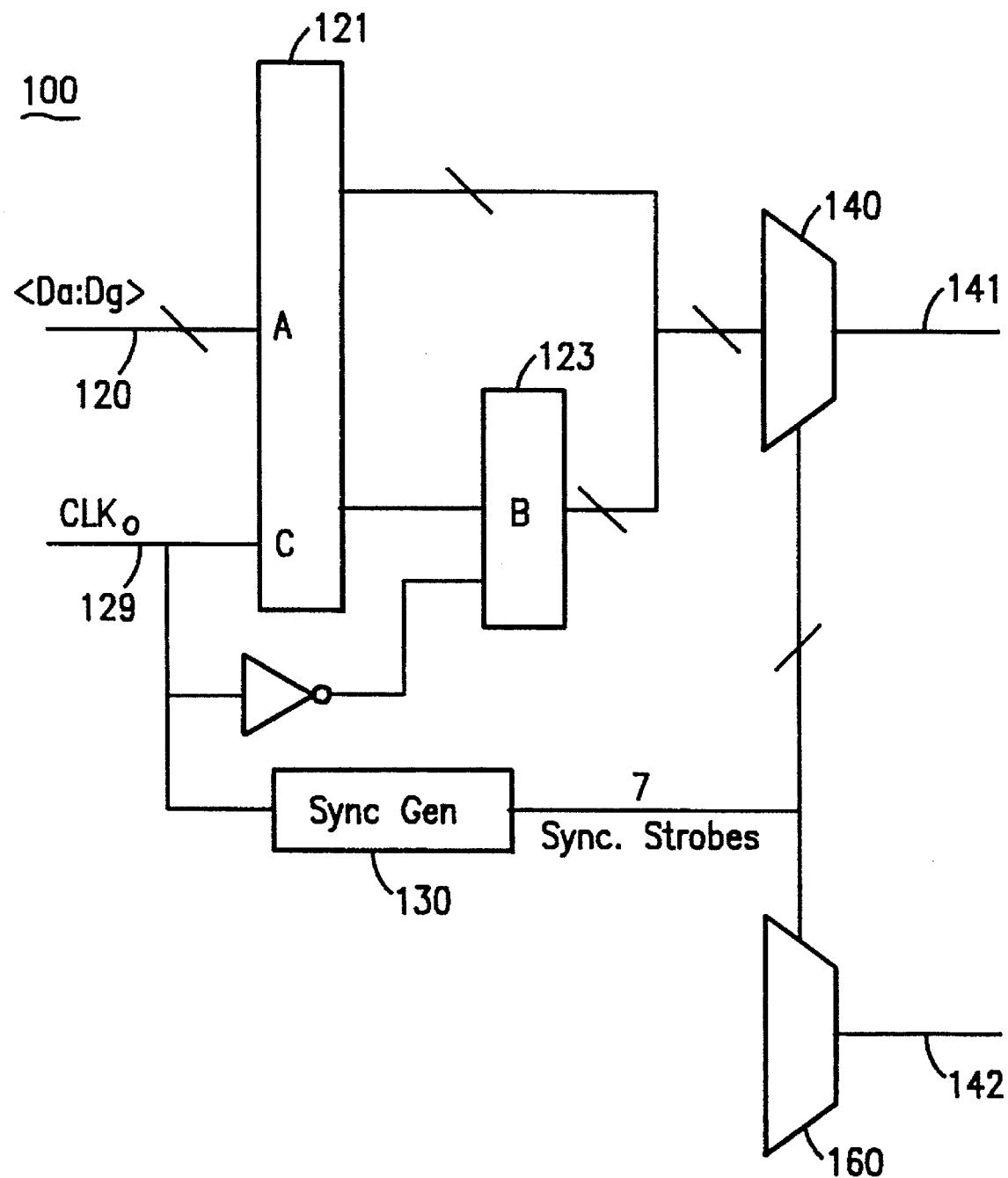
FIG. 7 is a block diagram of a data source circuit of the present invention, with a source buffer/latch.

Referring to FIG. 7, there is shown an embodiment of the present invention which employs a source latch/buffer mechanism. Multi-bit words presented to data input 120 are presented to a first source latch 121. $CLK_0$, while still being an input to synchronization signal generator 130, is additionally an input to first source latch 121.

Figure 8:
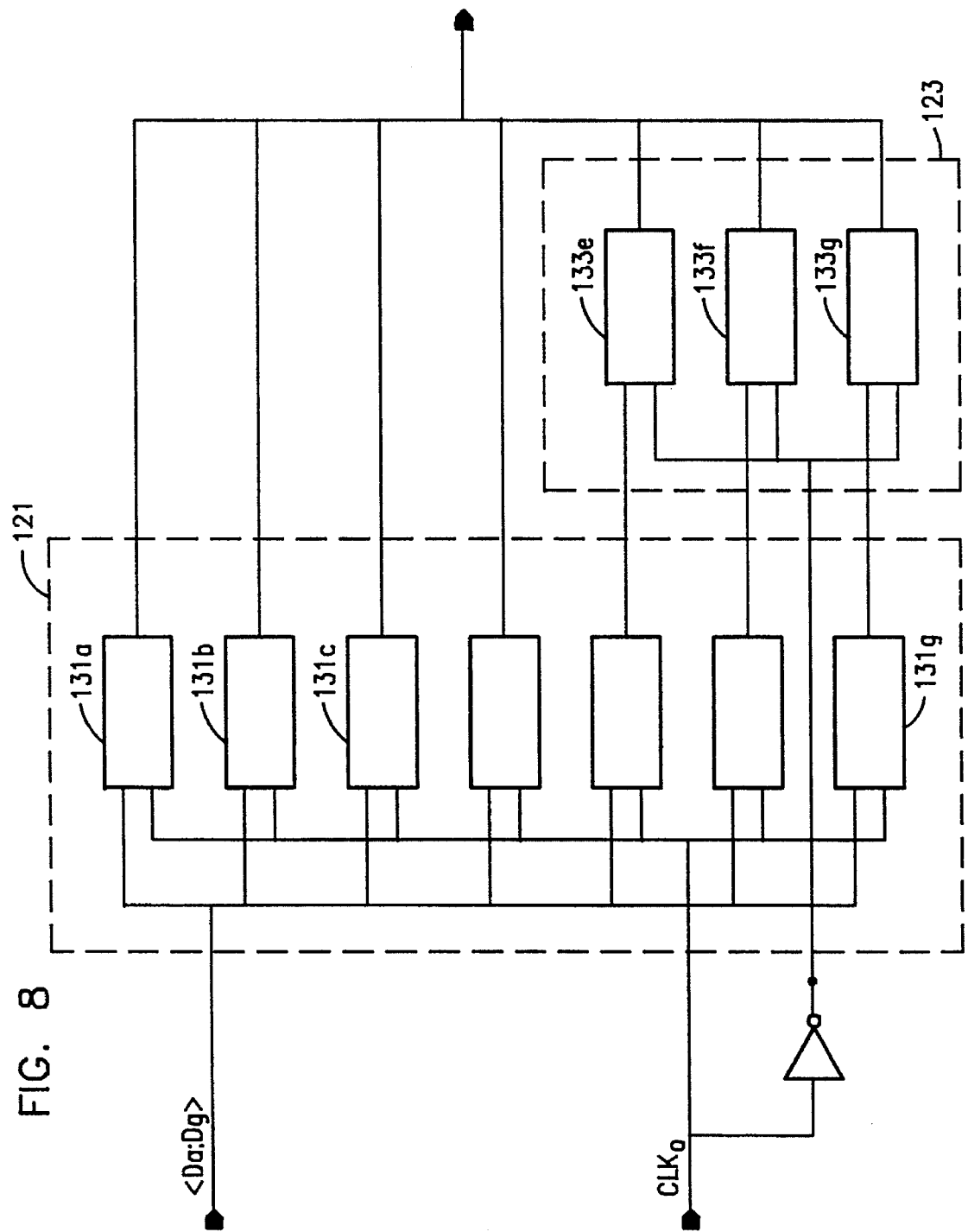
FIG. 8 is a block diagram of the source buffer/latch of FIG. 7.

Data bits $D_a$–$D_g$ are fed through first source latch 121 responsive to rising edges of $CLK_0$ and latched responsive to falling edges of $CLK_0$. Referring to FIG. 8, latch 121 is made up of seven sub-latches 131a–131g, one sub-latch 131a–131g, respectively, for each bit $D_a$–$D_g$, respectively.

Data bits $D_e$–$D_g$ are fed through second source latch 123, from first source latch 121, responsive to falling edges of $CLK_0$ (or, more precisely as can be seen from FIG. 8, responsive to a rising edge of an inverted $CLK_0$ signal) and latched responsive to rising edges of $CLK_0$. Second latch 123 is made up of three sub-latches 133e–133g, respectively, for latching each bit $D_e$–$D_g$, respectively, from sub-latches 131e–131g, respectively.

Finally, when first source latch 121 opens, it presents data bits $D_a$–$D_d$ to transmitter 140; when second source latch 123 opens, it presents data bits $D_e$–$D_g$ to transmitter 140.

Figure 9:
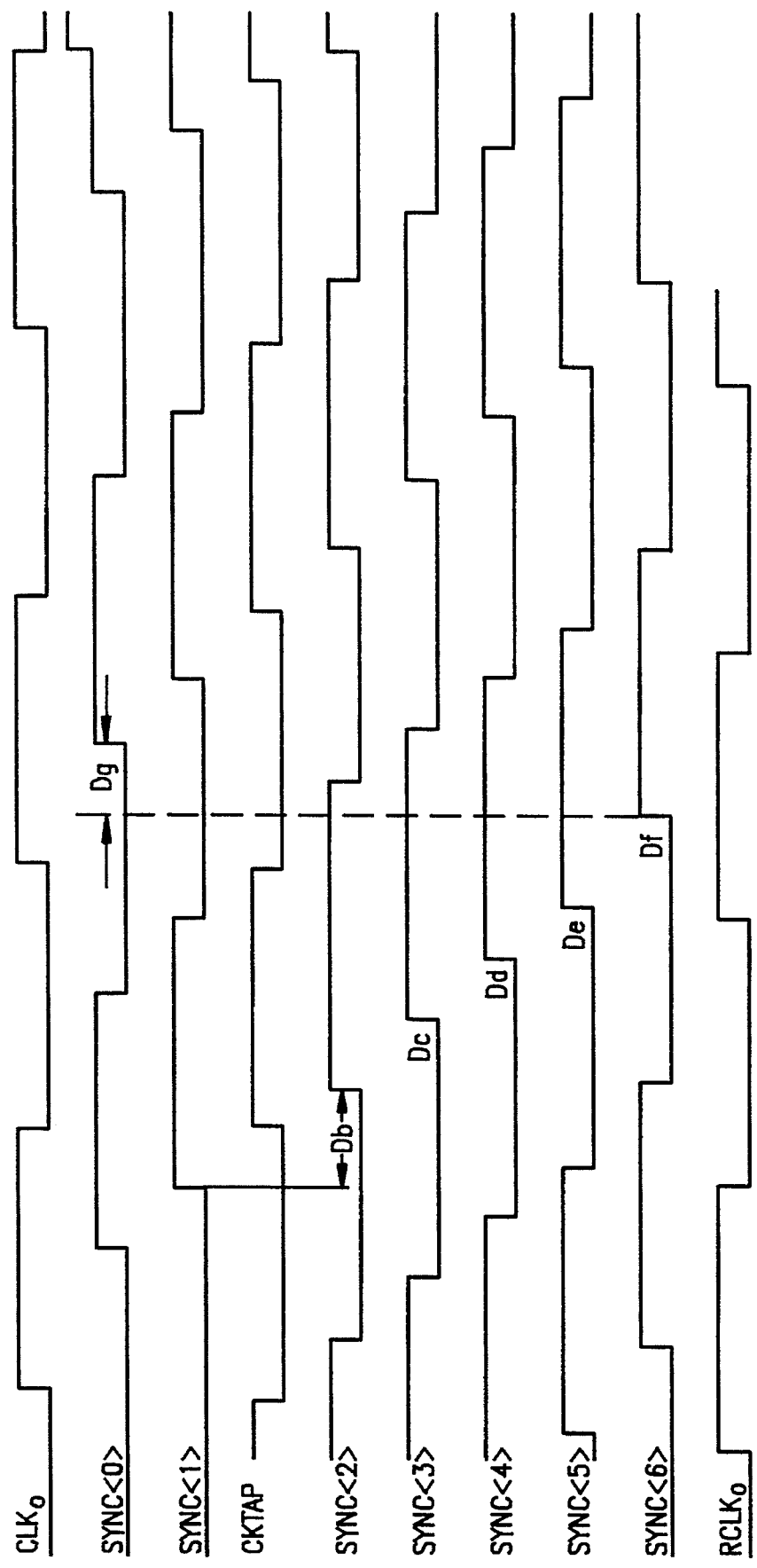
FIG. 9 is a timing diagram showing the relative timing of the source clock signal and synchronization signals, for an embodiment of the present invention which has a source buffer/latch.

Referring now to FIG. 9, there is shown a timing diagram for the transmission of data by transmitter 140 using the latch/buffer mechanism of FIG. 7. This timing diagram shows the particular data setup advantages of the buffer/latch mechanism of FIG. 7 over the direct input scheme of FIG. 3.

As shown in FIG. 9, when $CLK_0$ has a substantially 50% duty cycle, data bits $D_a$–$D_d$ are transmitted from first source latch 121 centered within a $CLK_0$ period, when data bits $D_a$–$D_d$ are most likely to be stable within first source latch 121. Furthermore, data bits $D_e$–$D_g$ are transmitted from second source latch 123 centered within inverted $CLK_0$ periods, when data bits $D_e$–$D_g$ are most likely to be stable within second source latch 123.

Figure 10:
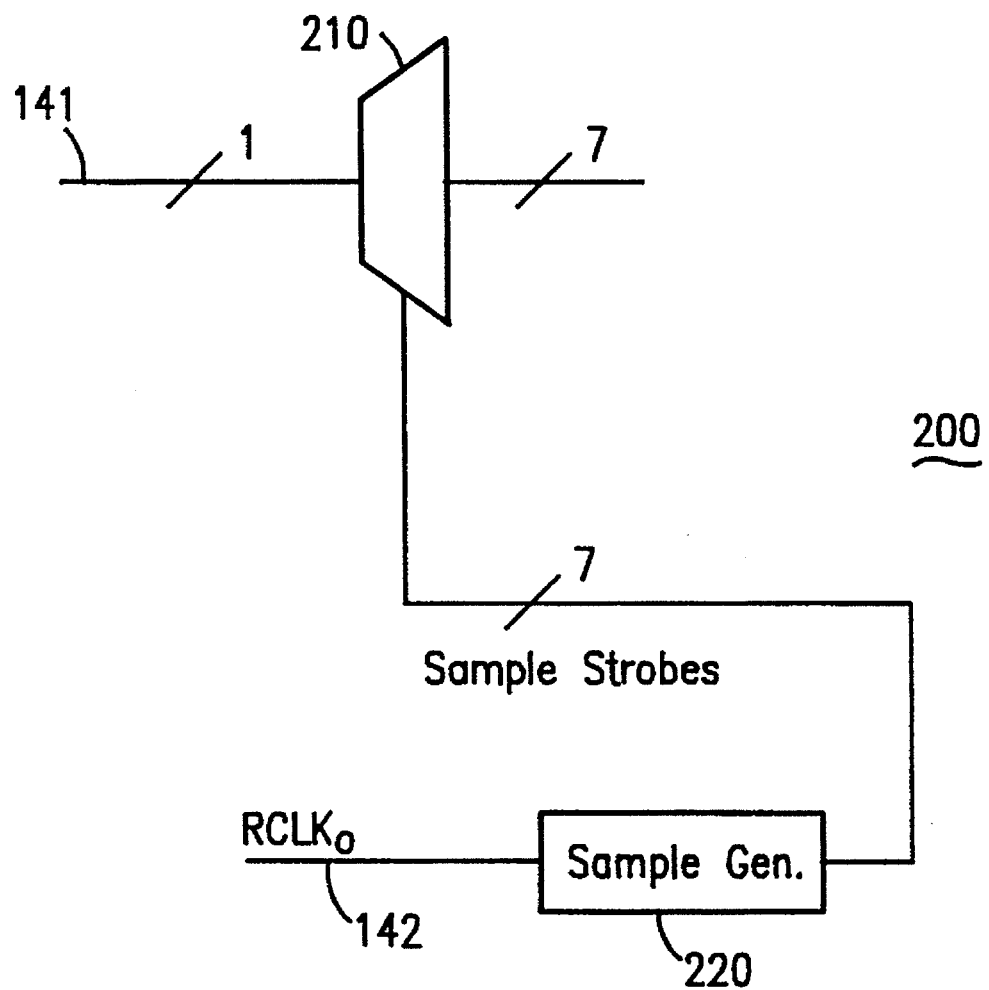
FIG. 10 is a block diagram of a data acquisition circuit of the present invention.

Referring now to FIG. 10, there is shown a data acquisition circuit 200 of the present invention for acquiring data transmitted by a data source circuit of the present invention (e.g. the data source circuits 100 of FIGS. 3 and 7).

First, data bits $D_a$–$D_g$ transmitted serially on data transmission line 141 by transmitter 140 of data source circuit 100 are presented to a sampler 210 of data acquisition circuit 200.

Meanwhile, sampling signal generator 220 receives an acquisition reference clock signal $RCKL_0$ on clock transmission line 142. As its name implies, and as is discussed in detail below, acquisition reference clock signal $RCLK_0$ is used by sampling circuit 200 to acquire data bits $D_a$–$D_g$ by synchronizing the sampling edges to the incoming data.

$RCLK_0$ may be nothing more than the source clock signal $CLK_0$, passed directly to the acquisition circuit 200 on clock transmission line 142. However, since data bits $D_a$–$D_g$ experience transmission propagation delays through transmitter 140 of data source circuit 100, it is essential to subject the source clock signal $CLK_0$ to similar propagation delays before passing it along to acquisition circuit 200 as acquisition reference clock signal $RCLK_0$. This is the function of acquisition reference clock signal generator 160.

Figure 11:
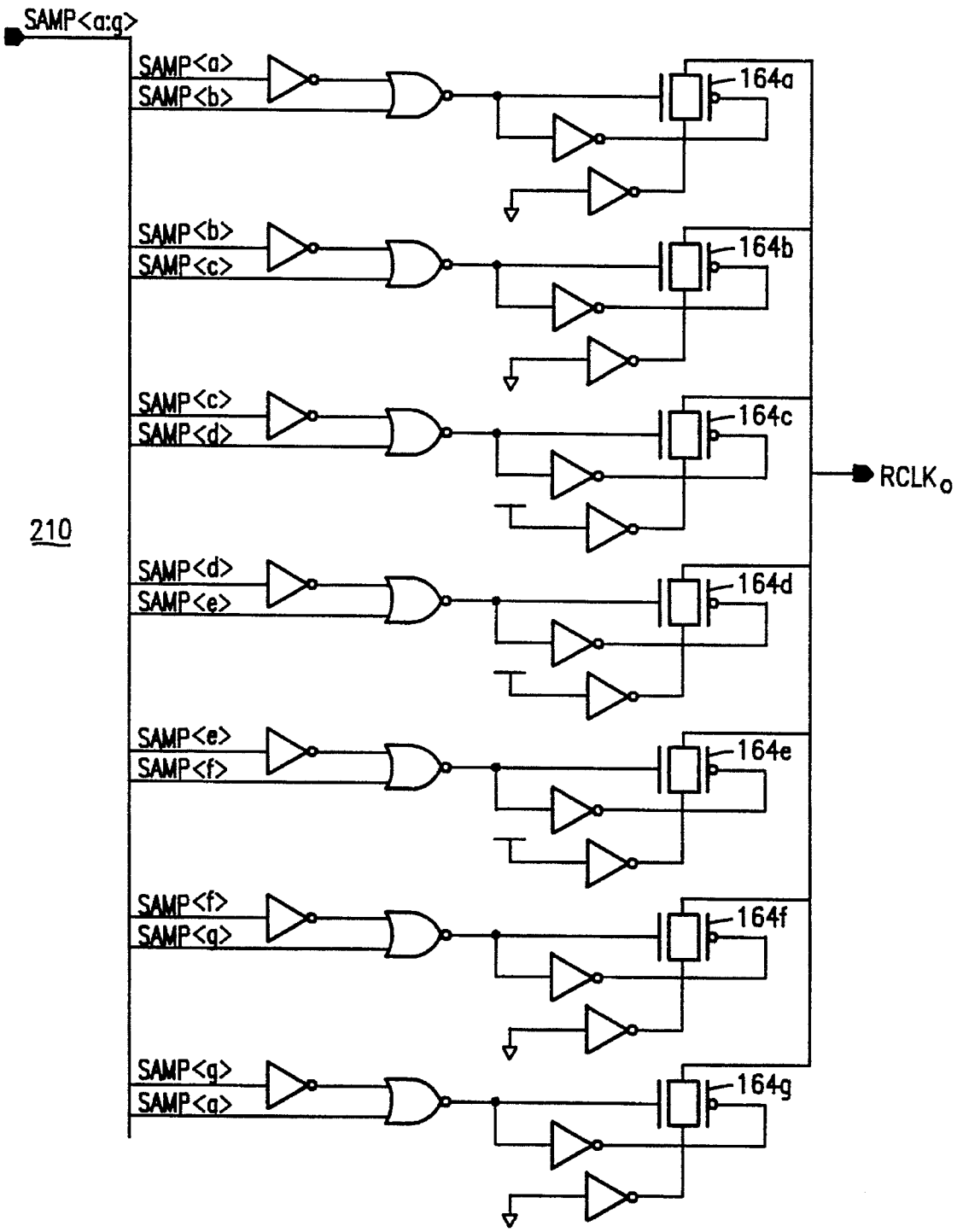
FIG. 11 is a schematic of an acquisition reference clock generator of the present invention.

FIG. 11 shows acquisition reference clock signal generator 160 in detail. Acquisition reference clock signal generator 160 is identical to transmitter 140 in most respects. However, the respective data inputs to transmission gates 164a–164g rather than being data bits $D_a$–$D_g$, are instead tied either high or low through inverting buffers 126a–126g. Specifically, the inputs to transmission gates 164a, 164b, 164f, and 164g are high; and the inputs to transmission gates 164c, 164d, and 164e are low.

Furthermore, if it is desired to properly replicate the falling edge of $CLK_0$ into $RCLK_0$ (i.e. to replicate substantially the 50% duty cycle of $CLK_0$), then STAP2, a signal output from delay element 152h of synchronization generator 130 in FIG. 3, may be replaced with a synchronization signal CKTAP, which is a signal output from delay element 152g instead. Such a substantially 50% duty cycle acquisition reference clock signal may be necessary for implementing an acquisition latch/buffer mechanism, similar to the source latch/buffer mechanism described above.

As a consequence of tying the inputs of the transmission gates 164a–164g, and replacing SYNC2 with CKTAP, $RCLK_0$, output by acquisition reference clock signal generator 160 onto acquisition reference clock data output line 142, is identical to source clock signal $CLK_0$, but delayed similarly to data bits $D_a$–$D_g$ propagated through transmitter 140.

Figure 12:
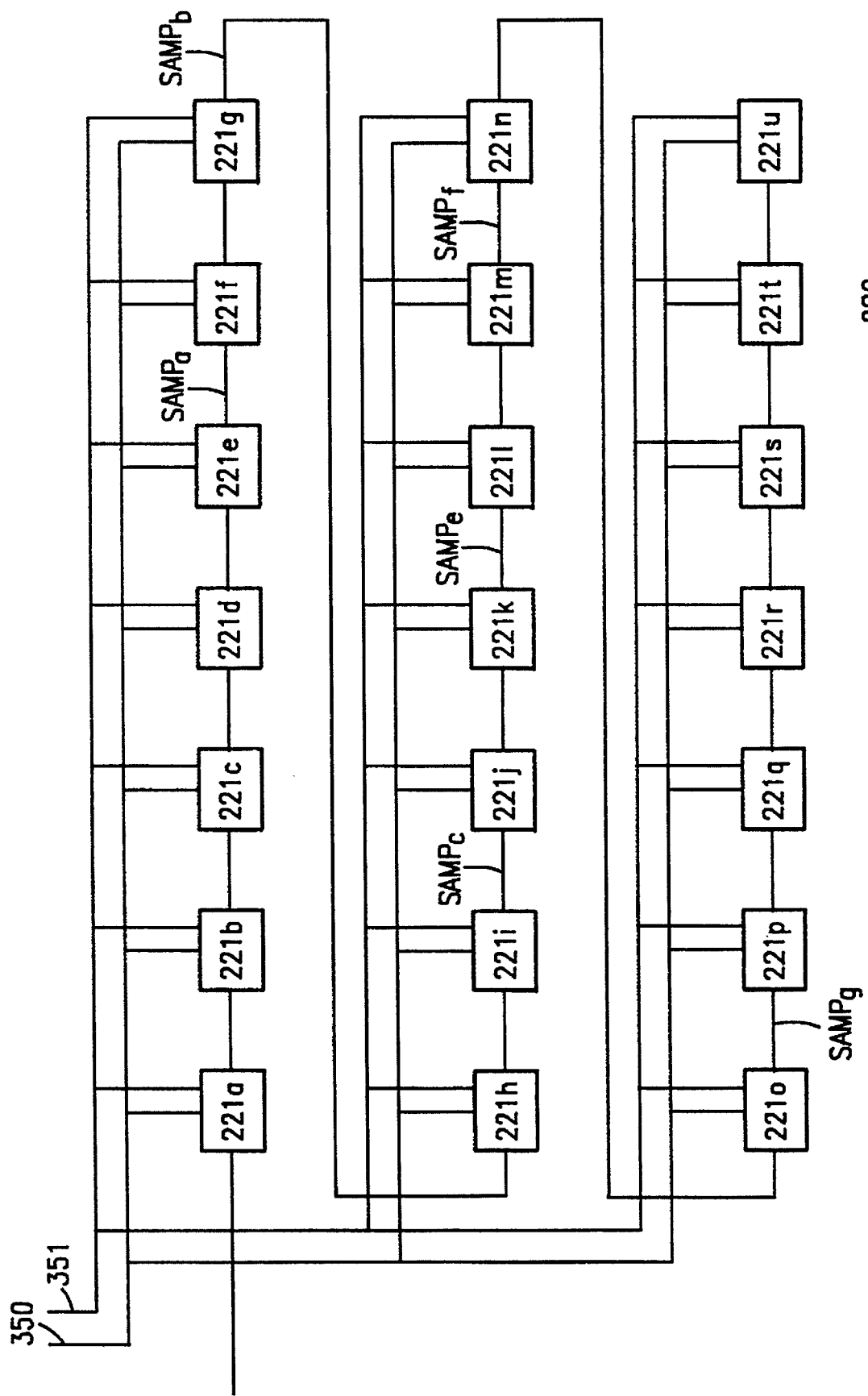
FIG. 12 is a schematic of a sampling signal generator of the present invention.

$RCLK_0$, however generated, is presented to sampling signal generator 220. Sampling signal generator 220 is similar to synchronization signal generator 130. Referring now to FIG. 12, within sampling signal generator 220, $RCLK_0$ is passed through twenty-one successive delay elements 221a–221s of sampling signal generator 220. It should be noted that the delay elements 221a–221u are not necessarily identical to the delay elements 31a–31g or pulse width controllers 33a–33g of conventional data source circuit 10.

Outputs of delay inverters 221e, 221g, 221i, 221k, 221m, 221o, and 221q are "tapped" to obtain periodic sampling signals $SAMP_a$–$SAMP_g$, respectively. Sampling signals $SAMP_a$–$SAMP_g$ are of the same period and frequency as $RCLK_0$, and each sampling signal is phase-delayed from a previous sampling signal. That is, $SAMP_b$ is phase delayed from $SAMP_a$; $SAMP_c$ from $SAMP_b$; and on up to $SAMP_g$, which is phase delayed from $SAMP_f$. $SAMP_a$ is phase-delayed from $SAMP_g$ due to the period nature of the sampling signals.

Figure 13:
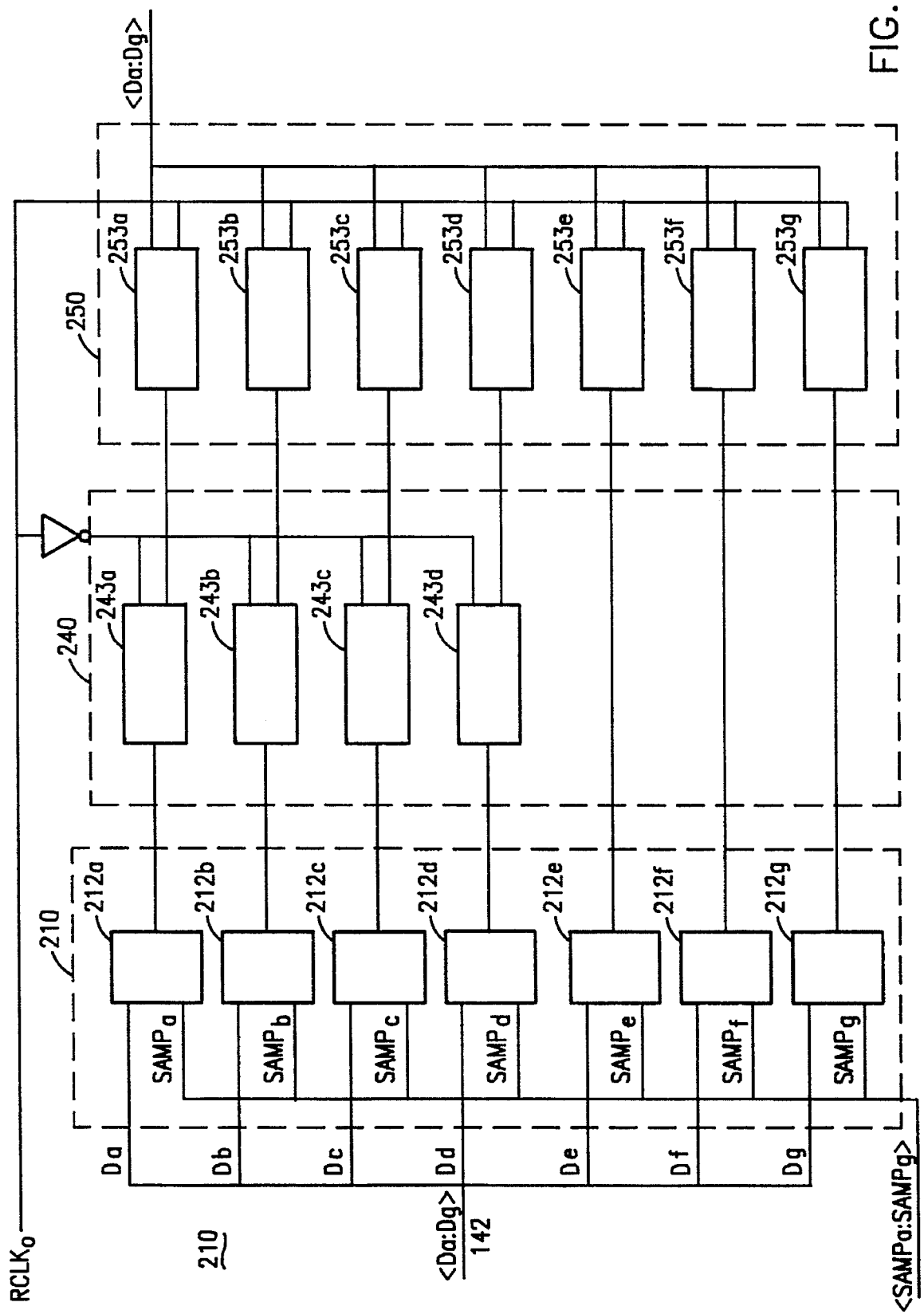
FIG. 13 is a block diagram of an acquisition buffer/latch, as shown in FIG. 10.

Referring now to FIG. 13, sampling signals $SAMP_a$–$SAMP_g$, respectively, are presented to separate sub-samplers 212a–212g, respectively, within sampler 210. Sub-samplers 212a–212g are sequential logic elements, such as flip-flops, which latch their inputs concurrent with a rising edge of a clock.

Delay elements 221a–221u of sampling signal generator 220 should be matched to delay elements 152a–152t of synchronization signal generator 130 so that the rising edges of each sampling signal $SAMP_a$–$SAMP_g$, respectively, synchronize with each incoming data bit $D_a$–$D_g$, respectively, on data transmission line 142.

It will therefore be appreciated by one skilled in the art that should delay elements 152a–152t of synchronizer 130 be chosen such that a source latch/buffer is required in order to extend the time that multi-bit data words presented to input 120 are available for transmission by transmitter 140, so also will an acquisition latch/buffer be required to extend the time in which data acquisition circuit can hold the acquired data before it is overwritten.

Such an acquisition latch/buffer is shown in FIG. 13. Data bits $D_a$–$D_d$ latched by sub-samplers 212a–212d are presented to a first acquisition latch 240. Inverted $RCLK_0$ is additionally input to first acquisition latch 240.

Data bits $D_a$–$D_d$ are fed through first acquisition latch 240 responsive to falling edges of $RCLK_0$ (or, more precisely as can be seen from FIG. 13, responsive to a rising edge of an inverted $RCLK_0$ signal) and latched by first acquisition latch 240 responsive to rising edges of $RCLK_0$. Referring still to FIG. 13, latch 240 is made up of four sub-latches 243a–243d, one sub-latch 243a–243d, respectively, for each bit $D_a$–$D_d$, respectively.

Data bits $D_a$–$D_g$ are fed through second acquisition latch 250, bits $D_a$–$D_d$ from first acquisition latch 240 and bits $D_e$–$D_g$ from sampler 210, responsive to rising edges of $RCLK_0$ and latched by second acquisition latch 250 responsive to falling edges of $RCLK_0$. Second acquisition latch 250 is made up of seven sub-latches 253e–253g, respectively, for latching each bit $D_a$–$D_g$, respectively.

Figure 14:
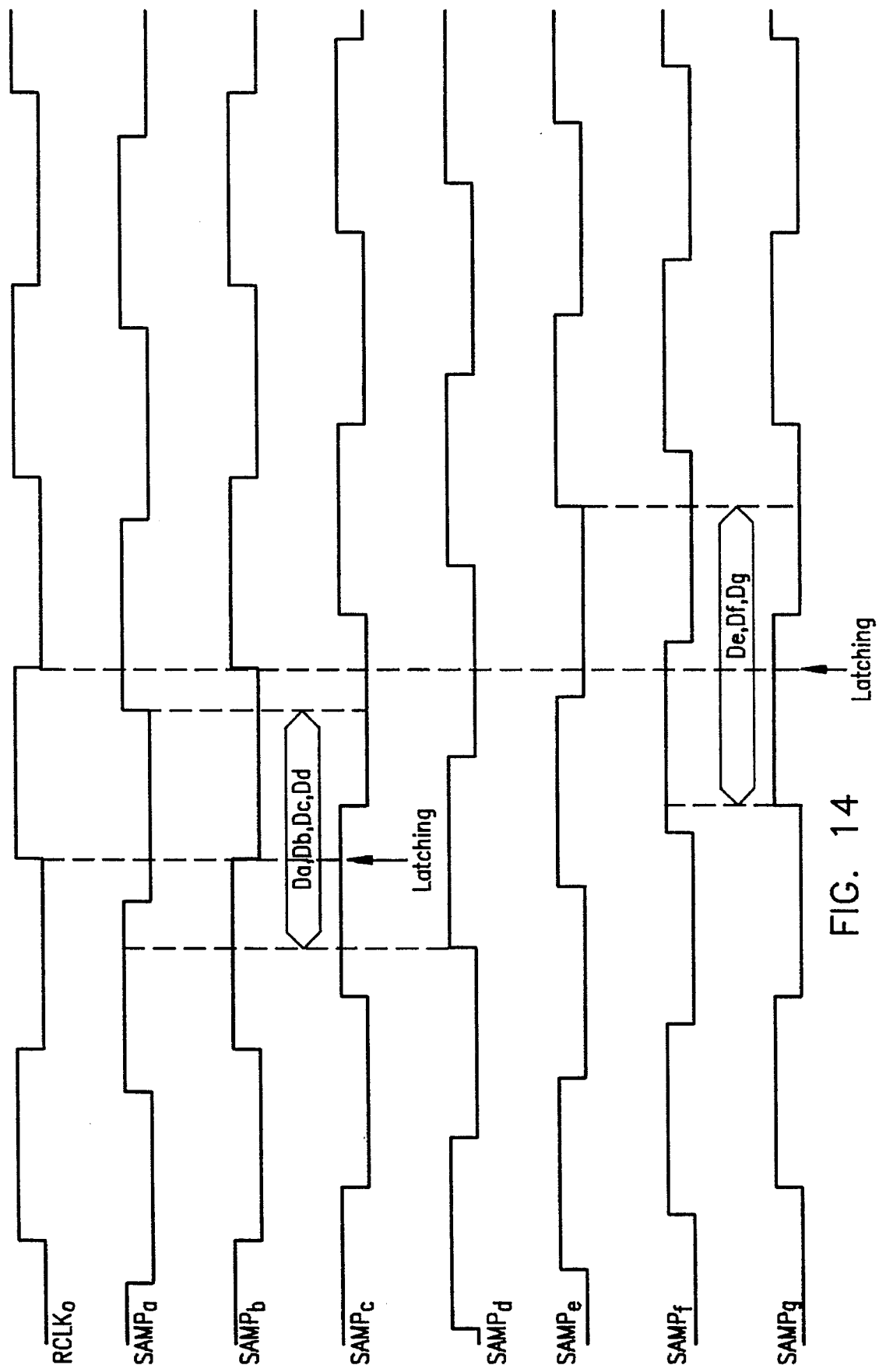
FIG. 14 is a timing diagram which shows the relative timing of the acquisition reference clock and the sampling signals.

Referring now to FIG. 14, there is shown a timing diagram for the acquisition of data by sampler 210 using the acquisition latch/buffer mechanism of FIG. 13. This timing diagram shows the particular data setup advantages of the buffer/latch mechanism.

As shown in the timing diagram of FIG. 14, when $RCLK_0$ has a substantially 50% duty cycle, data bits $D_a$–$D_d$ are latched by first acquisition latch from sampler 210 centered within an inverted $RCLK_0$ period, when data bits $D_a$–$D_d$ are most likely to be stable within sampler 210. Furthermore, data bits $D_e$–$D_g$ are latched by second acquisition latch 250 centered within $RCLK_0$ periods, when data bits $D_e$–$D_g$ are most likely to be stable within sampler 210.

Figure 15:
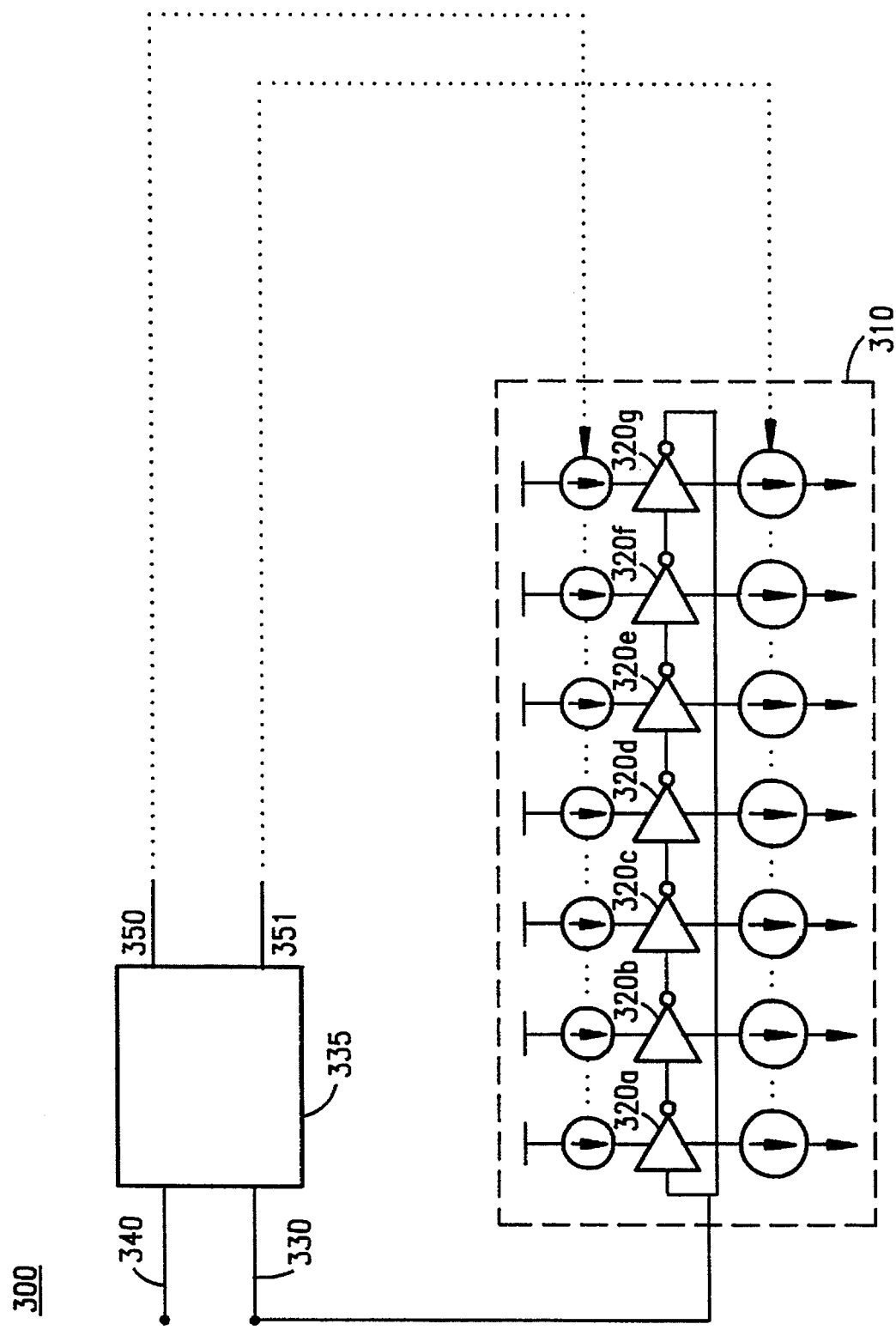
FIG. 15 is a phase lock loop used with the present invention.

Referring now to FIG. 15, a block diagram of a phase lock loop 300, used in conjunction with the present invention to calibrate synchronization signal generator and sampling signal generator delays, is shown. Phase lock loops are well known in the art.

An oscillator may be constructed of an odd number of inverters; with power applied to the inverters, an oscillating signal will result. A ring oscillator 310 within the phase lock loop 300 has seven inverters 320a–320g to cancel the difference. An oscillating signal output is presented to a feedback input 330 of a phase detector 335. A stable reference clock signal, preferably the acquisition reference clock signal $RCLK_0$, is presented to a reference input 340 of the phase detector 335.

The phase detector 335 compares the phase of the signal at its feedback input 330 to the phase of the reference signal, at its reference input 340. If these phases differ, the phase detector outputs command signals on control lines 350,351 to control the delays of the inverters 320a–320g.

Furthermore, inverters 152a–152t of synchronization generator 130 and inverters 221a–221u of sampling generator 220 may be chosen to be identical to inverters 320a–320g. By using the phase detector command signals to also control the delays of the synchronization generator inverters 152a–152t and the sampling generator inverters 221a–221u, these delays also may be calibrated to the reference clock, in order to insure synchronization of the serial transmission and sampling of the data bits of the multi-bit words.

Figure 16:
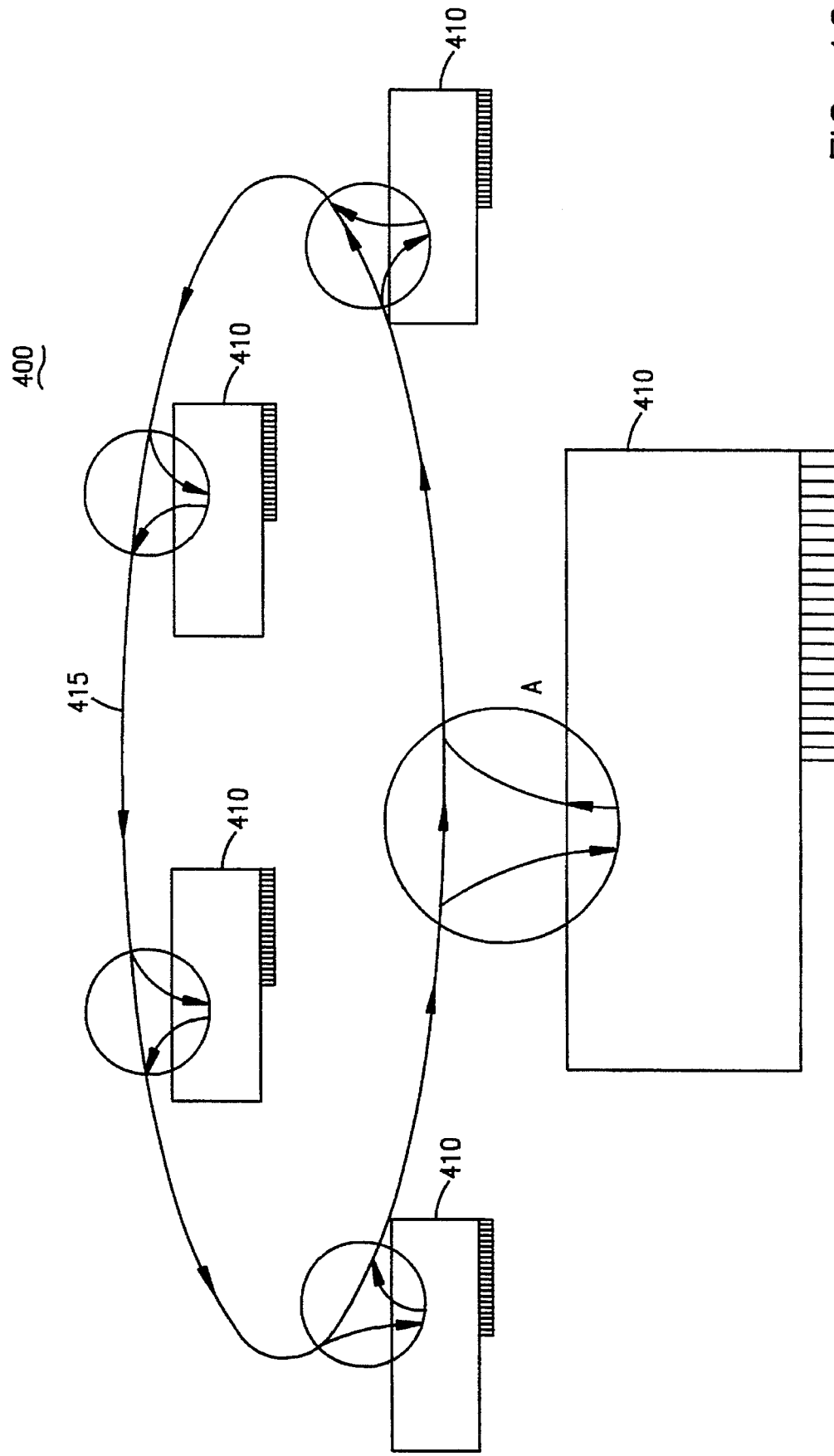
FIG. 16 is a point-to-point ring-type network for which a mode implementation of the present invention is particularly suited.

In a preferred embodiment, the present invention is used in a ring-type, unidirectional point-to-point data transmission network 400 such as is shown in FIG. 16. Each "point" of the network is a node 410 which includes an acquisition circuit 200 for receiving data from a ring 415 either to forward the data or to make the data available to a processor (not shown); and a source circuit 100 for transmitting data down to the ring.

Furthermore, the example of a 7-bit word presented to input 120 can be multiplied. That is, for example, a 42-bit word can be presented to 6 one-bit outputs, and the 6-bits transmitted in parallel. This implementation has a benefit that the individual one-bit channels can be matched in fabrication.

It is claimed:

1. A data source circuit, comprising:

means for receiving a periodic source clock signal having a period T;

a synchronization signal generator for generating, based on said source clock signal, a series of two or more periodic synchronization signals having periods equal to T, each synchronization signal being delayed from a previous synchronization signal; and a transmitter for transmitting two or more separate sub-words of a multi-bit data word, each separate sub-word having one or more bits and being transmitted responsive to a separate combination of two progressively delayed synchronization signals.

2. A data source circuit as in claim 1, further comprising:

a source buffer for providing said multi-bit data word to said transmitter.

3. A data source circuit as in claim 2, said source buffer comprising:

a first source latch for latching said multi-bit data word responsive to a transition of said source clock signal; and a second source latch for latching a portion of said multi-bit data word from said first source latch responsive to an opposite transition of said source clock signal wherein said source buffer provides said portion of said multi-bit data word to said transmitter from said second source latch and said source buffer provides a remainder of said multi-bit data word to said transmitter from said first source latch.

4. A data source circuit as in claim 3, wherein said source clock signal has a substantially 50% duty cycle.

5. A data source circuit as in claim 1, wherein said synchronization signal generator includes a phase-lock loop for calibrating the generation of said synchronization signals to a reference signal.

6. A data source circuit as in claim 5, wherein said reference signal is an output of a crystal oscillator.

7. A data source circuit as in claim 1, further comprising:
an acquisition reference clock generator for producing, based on said synchronization signals, an acquisition reference clock signal synchronous with said source clock signal and having a period equal to T.

8. A data acquisition circuit, comprising:
means for receiving a periodic acquisition reference clock signal having a period T;
a sampling signal generator for generating, based on said acquisition reference clock signal, a series of two or more periodic sampling signals having periods equal to T, each sampling signal being delayed from a previous sampling signal; and
a sampler for sampling two or more sub-words of a multi-bit data word, each separate sub-word having one or more bits and being sampled responsive to a separate combination of two progressively delayed sampling signals.

9. A data acquisition circuit as in claim 8, further comprising:
a destination buffer for receiving said two or more sub-words of said multi-bit data word.

10. A data acquisition circuit as in claim 9, said destination buffer comprising:
a first destination latch for latching a first portion of each of said two or more sub-words from said sampler responsive to a first transition of said acquisition reference clock signal; and
a second destination latch for latching said first portion of said each of said two or more sub-words from said first destination latch and for latching a second portion of each of said two or more sub-words from said sampler responsive to a second transition of said acquisition reference clock signal.

11. A data acquisition circuit as in claim 10, wherein said acquisition reference clock signal has a substantially 50% duty cycle.

12. A data acquisition circuit as in claim 8, wherein said sampling signal generator includes a phase-lock loop for calibrating the generation of said sampling signals to a reference signal.

13. A data acquisition circuit as in claim 12, wherein said reference signal is an output of a crystal oscillator.

14. A data acquisition circuit as in claim 12, wherein said reference signal is said acquisition reference signal.

15. A data source and acquisition system, comprising:
means for receiving a periodic source clock signal having a period T;
a synchronization signal generator for generating, based on said source clock signal, a series of two or more periodic synchronization signals having periods equal to T, each synchronization signal being delayed from a previous synchronization signal;
a transmitter for transmitting two or more separate sub-words of a multi-bit data word, each separate sub-word having one or more bits and being transmitted responsive to a separate combination of two progressively delayed synchronization signals;
an acquisition reference clock generator for producing, based on said synchronization signals, an acquisition reference clock signal substantially synchronous with said source clock signal and having a period equal to T;
a sampling signal generator for generating, based on said acquisition reference clock signal, a series of two or more periodic sampling signals having periods equal to T, each sampling signal being delayed from a previous sampling signal;
a sampler for sampling said two or more sub-words of said multi-bit data word transmitted by said transmitter, each separate sub-word being sampled responsive to a separate combination of two progressively delayed or sampling signals.

16. A data acquisition/retransmission node comprising:
means for receiving a periodic acquisition reference clock signal having a period T;
a sampling signal generator for generating, based on said acquisition reference clock signal, a series of two or more periodic sampling signals having periods equal to T, each sampling signal being delayed from a previous sampling signal; and
a sampler for sampling two or more separate ones of a first set of sub-words of a multi-bit data word, each separate one of said first set of sub-words having one or more bits and being sampled responsive to a separate combination of two progressively delayed sampling signals;
means for receiving a periodic source clock signal having a period T;
a synchronization signal generator for generating, based on said source clock signal, a series of two or more periodic synchronization signals having periods equal to T, each synchronization signal being delayed from a previous synchronization signal; and
a retransmitter for retransmitting two or more separate ones of a second set of sub-words of said multi-bit data word, each of said second set of one or more sub-words having one or more bits, separate ones of said sub-words being transmitted responsive to a separate combination of two progressively delayed synchronization signals.

17. A data acquisition/retransmission node as in claim 16, further comprising:
a source buffer for providing said first multi-bit data word to said transmitter; and
a destination buffer for receiving said two or more sub-words of said second multi-bit data word from said sampler.

18. A data acquisition/retransmission node as in claim 17, wherein said source buffer comprises:
a first source latch for latching said first multi-bit data word responsive to a transition of said source clock signal; and
a second source latch for latching a portion of said first multi-bit data word from said first source latch responsive to an opposite transition of said source clock signal
wherein said source buffer provides said portion of said first multi-bit data word to said transmitter from said second source latch and said source buffer provides a remainder of said multi-bit data word to said transmitter from said first source latch.

19. A data acquisition/retransmission node as in claim 18, wherein said source clock signal has a substantially 50% duty cycle.

20. A data acquisition/retransmission node as in claim 17, wherein said destination buffer comprises:
a first destination latch for latching a tint portion of each separate one of said two or more sub-words of said second multi-bit data word from said sampler responsive to a first transition of said acquisition reference clock signal; and a second destination latch for latching said first portion of said each separate one of said two or more sub-words from said first destination latch and for latching a second potion of each separate one of said two or more sub-words from said sampler responsive to a second transition of said acquisition reference clock signal.

21. A data acquisition/retransmission node as in claim 20, wherein said acquisition reference clock signal has a substantially 50% duty cycle.

22. A data acquisition/retransmission node as in claim 16, wherein said synchronization signal generator includes a phase-lock loop for calibrating the generation of said synchronization signals to a reference signal.

23. A data acquisition/retransmission node as in claim 22, wherein said reference signal is an output of a crystal oscillator.

24. A data acquisition/retransmission node as in claim 22, wherein said reference signal is said acquisition clock signal.

25. A data acquisition/retransmission node as in claim 17, further comprising:

a acquisition reference clock generator for producing, based, on said synchronization signals, said acquisition reference clock signal substantially in phase with said source clock signal and having a period equal to T.

26. A data acquisition/retransmission node as in claim 17, wherein said sampling signal generator includes a phase lock loop for calibrating the generation of said sampling signals to a reference signal.

27. A data acquisition/retransmission node as in claim 17, wherein said reference signal is an output of a crystal oscillator.

28. A method of providing data, comprising steps of:

receiving a periodic source clock signal having a period T;

generating, based on said source clock signal, a series of two or mores periodic synchronization signals having periods equal to T, each synchronization signal being delayed from a previous synchronization signal; and transmitting two or more sub-words of a multi-bit data word, each sub-word having one or more bits and being transmitted responsive to a separate combination of two progressively delayed synchronization signals wherein the separate ones of said two or more sub-words is the data being provided.

29. A method of acquiring data, comprising steps of:

receiving a periodic acquisition reference clock signal having a period T;

generating, based on said acquisition reference clock signal, a series of two or more periodic sampling signals having periods equal to T, each sampling signal being delayed from a previous sampling signal; and sampling two or more sub-words of a multi-bit data word, each separate sub-word having one or more bits and being sampled responsive to a separate combination of two progressively delayed sampling signals.

30. A method for providing and acquiring data, comprising steps of:

receiving a periodic source clock signal having a period T;

generating, based on said source clock signal, a series of two or more periodic synchronization signals having periods equal to T, each synchronization signal being delayed from a previous synchronization signal;

transmitting two or more separate sub-words of a multi bit data word, each separate sub-word having one or more bits and being transmitted responsive to a separate combination of two progressively delayed synchronization signals;

producing, based on said synchronization signals, an acquisition reference clock signal substantially in phase with said source clock signal and having a period equal to T;

generating, based on said acquisition reference clock signal, a series of two or more periodic sampling signals having periods equal to T, each sampling signal being delayed from a previous sampling signal; and sampling said two or more sub-words of said multi-bit data word transmitted by said transmitter, each separate sub-word being sampled responsive to a separate combination of two progressively delayed sampling signals.

31. A transmitter for transmitting two or more sub-words of a multi-bit data word, each sub-word having one or more bits:

synchronization signal receiving means for receiving separate combinations of two progressively delayed synchronization signals, each synchronization signal having a period equal to T and each synchronization signal being delayed from a previous synchronization signal; and means for transmitting each separate one of said two or more sub-words responsive to said separate combinations of two progressively delayed synchronization signals.

* * * * *

UNITED STATES PATENT AND TRADEMARK OFFICE
CERTIFICATE OF CORRECTION

PATENT NO. : 5,619,686
DATED : April 8, 1997
INVENTOR(S) : Allan Lin et al.

It is certified that error appears in the above-indentified patent and that said Letters Patent is hereby corrected as shown below:

In Col. 12, line 9, delete "or" and replace with --of--.

In Col. 13, line 7, delete "potion" and replace with --portion--.

In Col. 13, line 26, after "based" delete --,--.

In Col. 13, line 40, delete "mores" and replace with --more--.

In Col. 14, line 18, delete "multi bit" and replace with --multi-bit--.

Signed and Sealed this

Sixteenth Day of September, 1997

Attest:

BRUCE LEHMAN

*Attesting Officer*  *Commissioner of Patents and Trademarks*